United States Patent [19]
Tseng

[11] Patent Number: 5,681,773
[45] Date of Patent: Oct. 28, 1997

[54] METHOD FOR FORMING A DRAM CAPACITOR

[75] Inventor: Horng-Huei Tseng, Hsinchu, Taiwan

[73] Assignee: Vanguard International Semiconductor Corp., Hsinchu, Taiwan

[21] Appl. No.: 738,575

[22] Filed: Oct. 28, 1996

[51] Int. Cl.$^6$ ............................................. H01L 21/8242
[52] U.S. Cl. ........................ 437/52; 437/60; 437/919
[58] Field of Search ............................ 437/52, 60, 919, 437/47

[56] References Cited

U.S. PATENT DOCUMENTS

| | | | |
|---|---|---|---|
| 5,545,582 | 8/1996 | Roh | 437/52 |
| 5,552,334 | 9/1996 | Tseng | 437/52 |
| 5,580,813 | 12/1996 | Hachisuka et al. | 437/52 |

*Primary Examiner*—Jey Tsai
*Attorney, Agent, or Firm*—Christensen O'Connor Johnson & Kindness, PLLC

[57] ABSTRACT

A method for forming a DRAM cell capacitor with increased capacitance includes forming a first dielectric layer and a silicon nitride layer over a substrate. Portions of the nitride layer and the first dielectric layer are then removed. A first doped polysilicon layer is then formed over the nitride layer and filling the first trench. The first doped polysilicon layer is etched back using the nitride layer as an etchstop, thereby forming a polysilicon plug in the first trench. A second dielectric layer is formed on the nitride layer and the polysilicon layer. A second photoresist layer is patterned on the second dielectric layer and reacted with a plasma gas to form a polymer spacer. A portion of the second dielectric layer is removed using the second photoresist layer and polymer spacer as a mask, thereby forming a second trench in the second dielectric layer. A second doped polysilicon layer is formed on the second dielectric layer and in the second trench. A third dielectric layer is formed over the second doped polysilicon layer to fill the second trench. The third dielectric layer is etched back to expose the second doped polysilicon layer, forming a dielectric plug in the second trench. The second doped polysilicon layer is etched back, thereby exposing the second dielectric layer. The dielectric plug and the second dielectric layer are then removed to form a bottom electrode of the capacitor of the DRAM cell.

16 Claims, 8 Drawing Sheets

METHOD FOR FORMING A DRAM CAPACITOR

BACKGROUND OF THE INVENTION

1. Field of the Invention

The present invention relates to dynamic random access memory (DRAM) fabrication, and more particularly to a method for forming a capacitor of a dynamic random access memory cell.

2. Background Art

Recently, demand for semiconductor devices has rapidly increased owing to widespread use of electronic equipment. In particular, the increasing popularity of some electronic equipment such as computers, for example, is increasing the demand for large semiconductor memories. FIG. 1 shows a simplified diagram of the organization of a typical large semiconductor memory 14. The storage cells of the memory 14 are arranged in an array including horizontal rows and vertical columns. The horizontal lines connected to all of the cells in the row are referred to as word lines 11, and the vertical lines connected to all of the cells in the column are referred to as bit lines 13. Data flow into and out of the cells via the bit lines 13.

Row address 10 and column address 12 are used to identify a location in the memory 14. A row address buffer 15 and a column address buffer 17 respectively receives row address 10 signals and column address 12 signals. The buffers 15 and 17 then drive these signals to a row decoder 16 and column decoder 18 respectively. The row decoder 16 and the column decoder 18 reduce the number of address lines needed for accessing a large number of storage cells in the memory 14. The row decoder 16 and the column decoder 18 then respectively select the appropriate word line and bit line corresponding to the received address signal, thereby selecting a particular memory cell of the memory 14 corresponding to the received address signals.

The array configuration of semiconductor memory 14 lends itself well to the regular structure preferred in the "very large scale integration" (VLSI) industry. For example, the memory 14 can be a dynamic random access memory (DRAM). DRAMs have become one of the most widely used types of semiconductor memory due to its low cost per bit, high device density and flexibility of use concerning reading and writing operations.

Early DRAMs used storage cells each consisting of three transistors and were manufactured using P type channel metal-oxide-semiconductor (PMOS) technology. Later, U.S. Pat. No. 3,387,286 titled "FIELD EFFECT TRANSISTOR MEMORY" by R. H. Dennard disclosed a DRAM storage cell structure consisting of one transistor and one capacitor. A circuit schematic diagram of a single transistor-single capacitor structure is shown in FIG. 2A. The memory cell includes a transistor 20, with a capacitor 22 connected to one end of the transistor's channel. The gate of the transistor 20 is controlled by a word line signal, and data represented by the logic level of the capacitor voltage, is written into or read out of the capacitor 22 through a bit line. FIG. 2B shows cross section of a traditional one-transistor DRAM storage cell that uses a polysilicon layer 24 as one plate of the capacitor. The substrate region under the polysilicon plate 24 serves as the other capacitor electrode. A voltage can be applied to the plate 24 to store a logic value into the capacitor.

As DRAM devices become more highly integrated, the area occupied by a capacitor of a DRAM storage cell typically shrinks. Consequently, the capacitor's capacitance decreases owing to the capacitor's smaller electrode surface area. However, a relatively large capacitance is required to achieve a high signal-to-noise ration in reading the memory cell and to reduce soft errors (due to alpha particle interference). Therefore, it is desirable to reduce the cell dimension and yet obtain a high capacitance, thereby achieving both high cell integration and reliable operation.

One approach for increasing the capacitance while maintaining the high integration of the storage cells is directed toward the shape of the capacitor electrodes. In this approach, the polysilicon layer implementing a capacitor electrode may have protrusions, fins, cavities, etc., to increase the electrode's surface area, thereby increasing the capacitor's capacitance while maintaining the small area occupied on the substrate surface. Consequently, this type of capacitor has come to be widely used in DRAM devices.

Another consideration in achieving high density memory devices is the limitations of lithography techniques widely used in the semiconductor industry. The so-called "minimum feature size" (i.e., the minimum line-width, contact dimensions, or line-to-line separation that can be formed on the substrate surface) of the photolithographic process limits the number of circuits that can be fabricated on the wafer. The minimum feature size is largely determined by the resolution of an optical imaging system used in the photolithography process. The minimum feature size can be reduced, but typically at the cost of further reducing the depth of focus and restricting the flexibility in the design of three dimensional structures. Thus, there is a need for a method of forming a DRAM capacitor with features that are smaller than the minimum feature size of the photolithographic process so that DRAM density can be increased.

SUMMARY

In accordance with the present invention, a method is provided for forming a DRAM capacitor that occupies a relatively small area of the wafer surface and having a relatively high capacitance. In this embodimemt, a dielectric layer such as an oxide layer is formed over the substrate using a chemical vapor deposition (CVD) method, typically to a thickness of about 3000 to 8000 angstrom. A silicon nitride layer is then deposited using a conventional low pressure chemical vapor deposition (LPCVD) process or a plasma-enhanced chemical vapor deposition (PECVD) process.

The silicon nitride layer is then planarized via use of an etch back or other conventional planarization method such as chemical mechanical polishing (CMP). Afterwards, conventional photolithography techniques are used to define a storage node area in a photoresist layer formed on the silicon nitride layer. The photoresist layer is patterned to expose a portion of the silicon nitride layer over a portion of the source of the memory cell transistor.

Using the photoresist layer as a mask, the silicon nitride layer and the oxide layer are etched, forming a trench that exposes a portion of the transistor's source. A relatively thick doped polysilicon layer is then formed over the silicon nitride layer and filling the trench.

The thick doped polysilicon layer is anisotropically etched back using the silicon nitride layer as an etchstop layer. A polysilicon plug is thus formed in the trench. Subsequently, another dielectric layer such as an oxide layer is formed on the silicon nitride layer and the polysilicon plug. A photoresist layer is then deposited over the oxide layer. The photoresist layer is then patterned to expose a portion of the oxide layer over the polysilicon plug.

A plasma gas such, as CHF$_3$, is then reacted with the photoresist layer to form a polymer layer on the sidewalls of the photoresist layer. The polymer layer on the sidewalls of the photoresist layer serves an etching mask that has a sub-minimum dimension opening.

Afterwards, an anisotropic etching process is performed to etch the second oxide layer, using the polymer layer as an etching mask. This etching process uses a buffered or diluted HF solution for etching the oxide. After this etching process, a second trench is formed that exposes a portion of the polysilicon plug. The polymer layer and the photoresist layer are then removed by a conventional etch method. As a result, the width of the second trench is smaller than the width of the polysilicon plug, thereby further increasing the density that is possible in manufacturing DRAM devices.

A relatively thin doped polysilicon layer is conformally formed over the surface and the sidewalls of the second oxide layer and the polysilicon plug. Another dielectric layer, such as an oxide layer, is formed on the thin polysilicon layer and filling the polysilicon lined trench. The third oxide layer is then etched back using the thin polysilicon layer as an etchstop layer, thereby forming an oxide plug in the second trench.

An etching process is further performed to etch the thin polysilicon layer until the surface of the second oxide layer is exposed. As a result of this etching process, only the portions of the thin polysilicon layer lining the trench remain. Afterwards, the oxide plug and the second oxide layer are removed, leaving the residual portions of the thin polysilicon layer intact. The resulting polysilicon structure includes a subminimum feature size trench and serves as a bottom electrode of the DRAM cell capacitor. The trench increases the surface area of the electrode, which increases the capacitance of the capacitor. Moreover, the bottom electrode has a very narrow horizontal cross-section, thereby resulting in a capacitor that occupies a relatively small area on the surface of the substrate.

DETAILED DESCRIPTION

Figure 1:
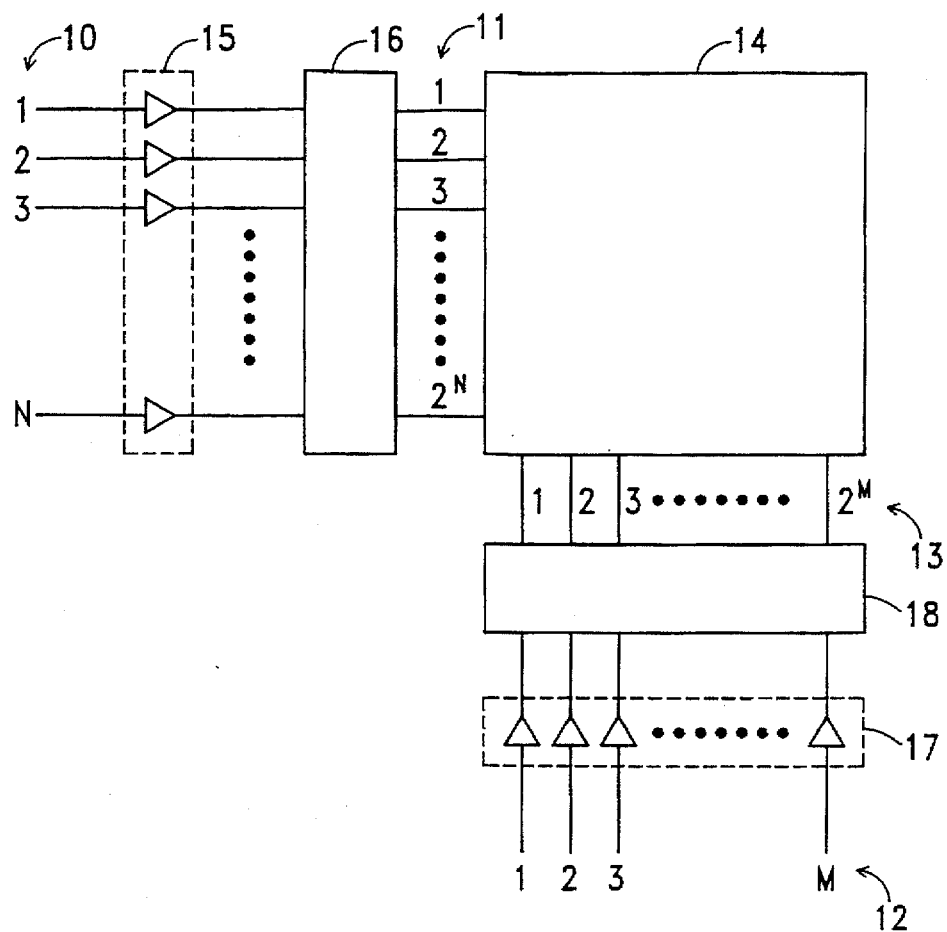
FIG. 1 shows a simplified diagram of the organization of large semiconductor memories.
Figure 2A:
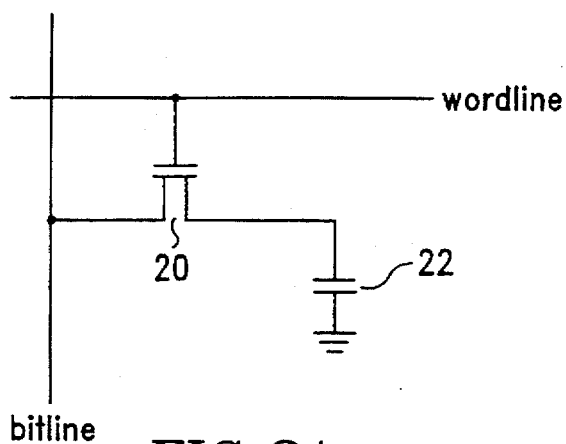
FIG. 2A shows a circuit schematic diagram of a dynamic random access memory (DRAM).
Figure 2B:
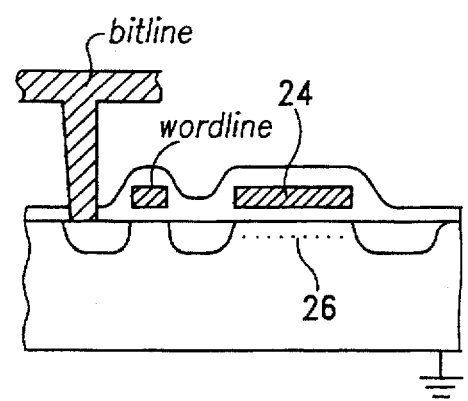
FIG. 2B shows a cross sectional view illustrative of a traditional one-transistor DRAM storage cell.
Figure 3:
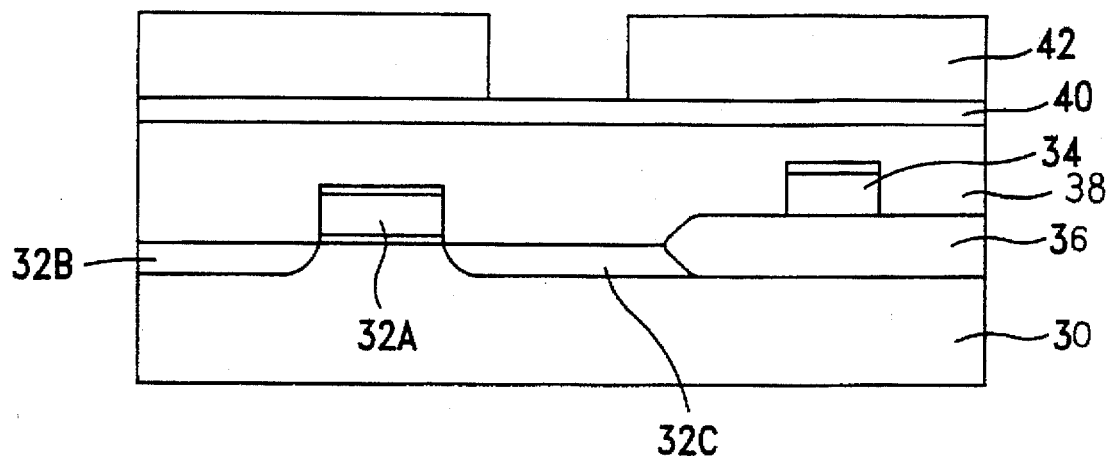
FIGS. 3 to 15 show cross-sectional views illustrative of various stages in the fabrication of a DRAM capacitor in accordance with one embodiment of the present invention.

Referring to FIG. 3, a metal-oxide-semiconductor field effect transistor (MOSFET) having a gate 32A, a drain 32B and a source 32C, is conventionally formed in and on the substrate 30. In addition, a field oxide (FOX) region 36 is conventionally formed in the substrate 30 adjacent to the source 32C. A word line 34 is formed on the FOX region 36. Typically, the word line 34 is made of doped polysilicon. In this embodiment, the MOSFET is a n-channel MOSFET that forms part of a dynamic random access memory (DRAM) cell. A dielectric layer such as an oxide layer 38 is formed over the MOSFET and on the substrate 30 using a chemical vapor deposition (CVD) method, typically to a thickness of about 3000 to 8000 angstroms. The oxide layer 38 is then planarized by a conventional planarization method such as, for example, chemical mechanical polishing (CMP). A silicon nitride layer 40 is then deposited on the planarized oxide layer 38 using a conventional low pressure chemical vapor deposition (LPCVD) process or a plasma-enhanced chemical vapor deposition (PECVD) process. The thickness of the silicon nitride layer 40 can be about 500 to 1500 angstroms.

The silicon nitride layer 40 is then planarized, via use of an etch back or other conventional planarization method such as CMP. Afterwards, conventional photolithography techniques are used to define a storage node area in a photoresist layer 42 formed on silicon nitride layer 40. The photoresist layer 42 is patterned to expose a portion of the silicon nitride layer 40 over the source 32C. In order to fabricate a high density DRAM, the width of the exposed portion of the silicon nitride layer 40 is chosen at or near the minimum feature size.

Figure 4:
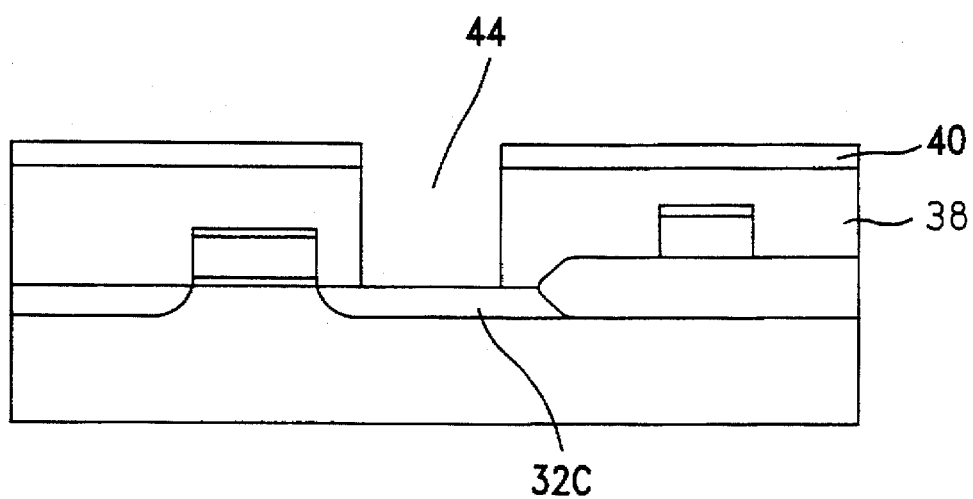

Using the photoresist layer 42 as a mask, the silicon nitride layer 40 and the oxide layer 38 are anisotropically etched. In this embodiment, a heated solution of phosphoric acid, H$_3$PO$_4$ is used to etch the nitride, and a diluted HF solution is used to etch the oxide. A trench 44 is thus formed in the silicon nitride layer 40 and the oxide layer 38 as shown in FIG. 4, exposing a portion of the source region 32C.

Figure 5:
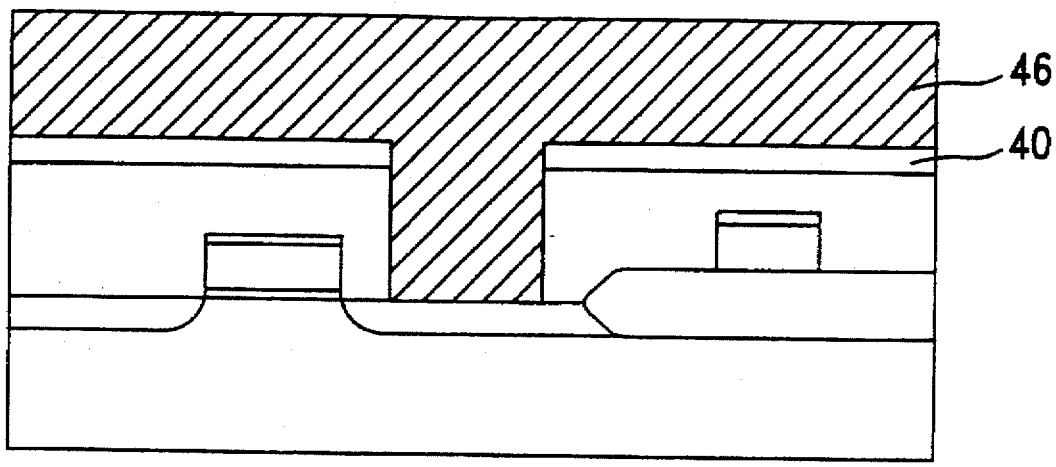

A relatively thick doped polysilicon layer 46, shown in FIG. 5, is formed over the silicon nitride layer 40 so as to fill the trench 44. The nominal thickness of the doped polysilicon layer 46 above the silicon nitride layer 40 is about 2000 to 5000 angstroms. Typically, the polysilicon layer 46 is doped with phosphorus dopants at a concentration of about 5E20 to increase conductivity.

Figure 6:
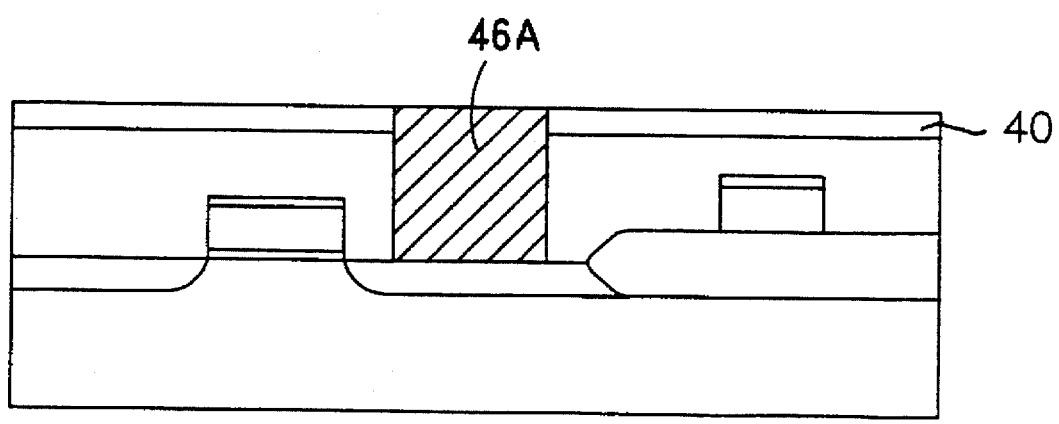

The thick doped polysilicon layer 46 is anisotropically etched back using the silicon nitride layer 40 as an etchstop layer. As shown in FIG. 6, a polysilicon plug 46A is thus formed in the trench 44. Subsequently, a dielectric layer 48 is formed on the silicon nitride layer 40 and the polysilicon plug 46A. In this embodiment, the dielectric layer 48 is an oxide layer formed by using a CVD method, to a thickness of about 3000 to 6000 angstroms.

Figure 7:
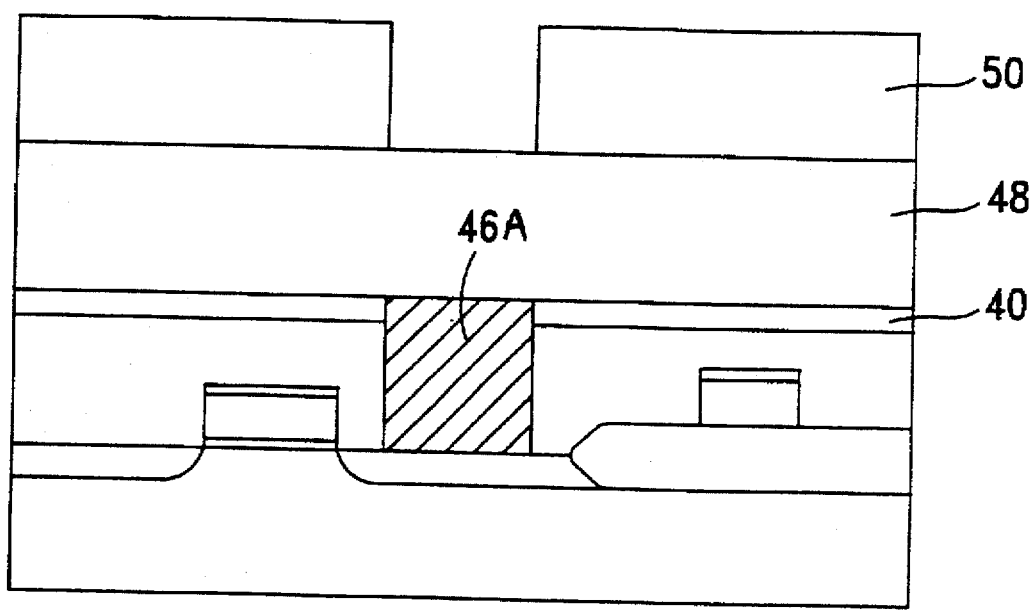

Conventional photolithography techniques are then used to form and pattern a photoresist layer 50 on the oxide layer 48. As shown in FIG. 7, the photoresist layer 50 is patterned to form a trench exposing a portion of the oxide layer 48 over the polysilicon plug 46A. In order to fabricate a high density transistor, the width of the trench in the photoresist layer 50 is at or near the minimum feature size. The exposed portion of the oxide layer 48 is preferably aligned with the polysilicon plug 46A.

Figure 8:
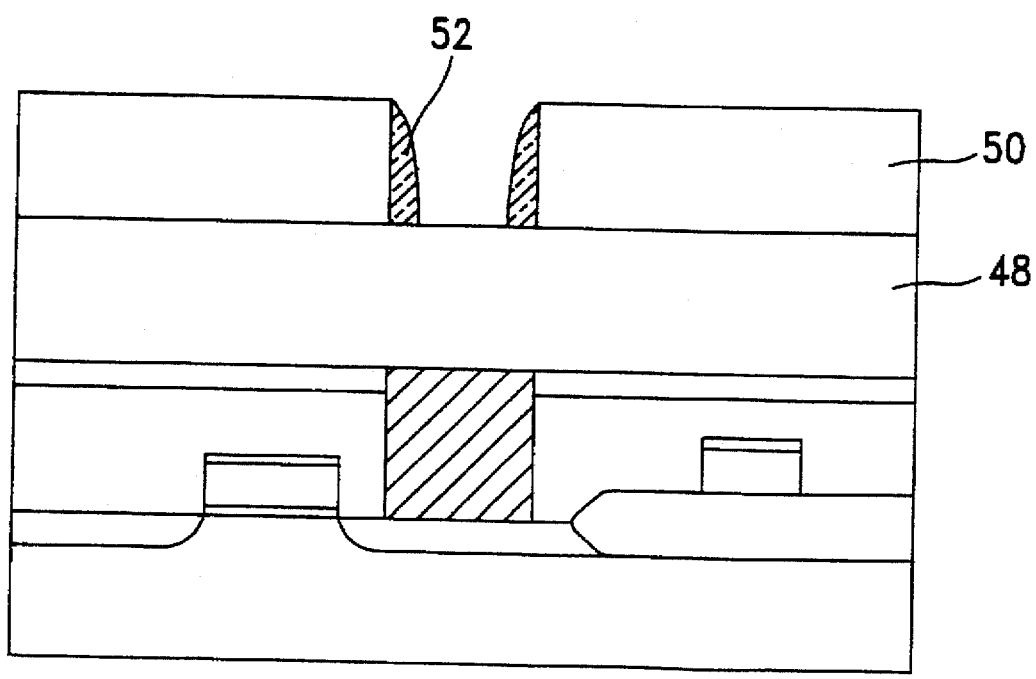

Referring to FIG. 8, a plasma gas, such as CHF$_3$, is then reacted with the photoresist layer 50 to form a non-volatile organic polymer layer or spacer 52 on the sidewalls of the trench in the photoresist layer 50. In this embodiment, the polymer layer 52 has a width of about 0.05 to 0.15 µm. The photoresist layer 50 together with the polymer layer 52 on the sidewall of the trench serves as an etching mask that has a sub-minimum dimension opening.

Figure 9:
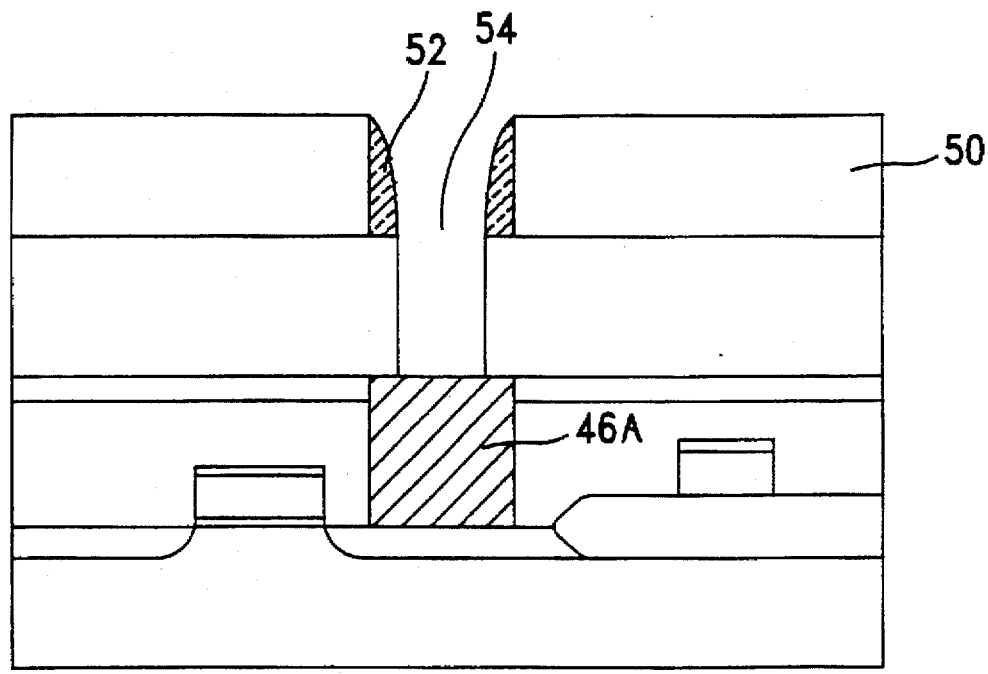
Figure 10:
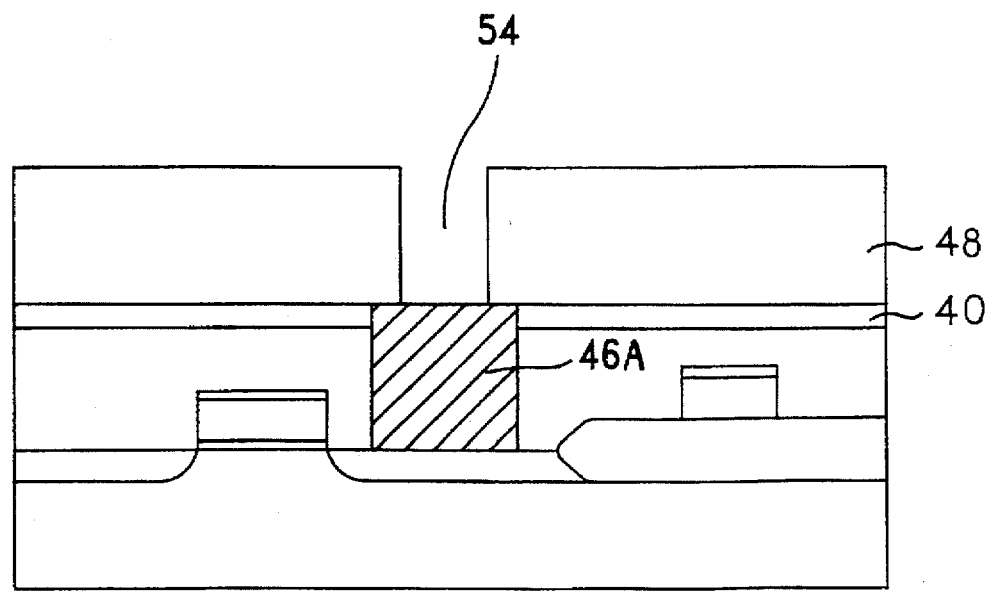

Afterwards, an anisotropic etching process is performed to etch the oxide layer 48, using the photoresist layer 50 and the polymer layer 52 as an etching mask. In this embodiment the etching process uses a buffered or diluted HF solution to etch the oxide. As shown in FIG. 9, after this etching process, a sub-minimum dimension trench 54 is formed that exposes a portion of the polysilicon plug 46A. The polymer layer 52 and the photoresist layer 50 are then removed by a conventional etch method. In this embodiment, the process uses an H$_2$SO$_4$ etchant. The resulting structure is shown in FIG. 10.

Figure 11:
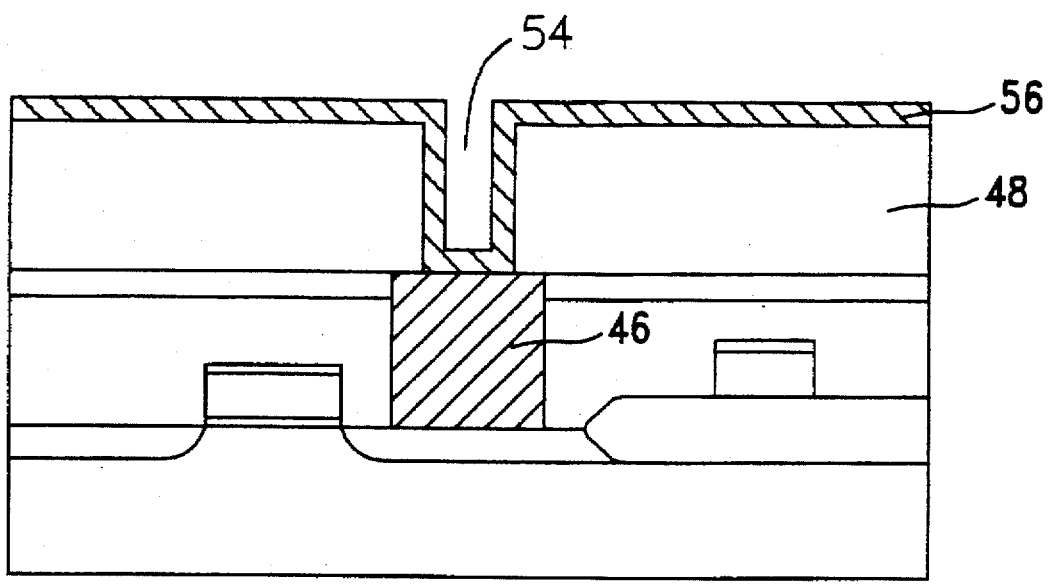

A relatively thin doped polysilicon layer 56, as shown in FIG. 11, is conformally formed over the surface and the sidewalls of the oxide layer 48 and the polysilicon plug 46A using a low pressure CVD (LPCVD) process. The nominal thickness of the doped polysilicon layer 56 is about 1000 angstroms, but can range from about 150 to 1500 angstroms. Typically, the polysilicon layer 56 is doped with phosphorus dopants at a concentration of about 5E20 to increase conductivity.

Figure 12:
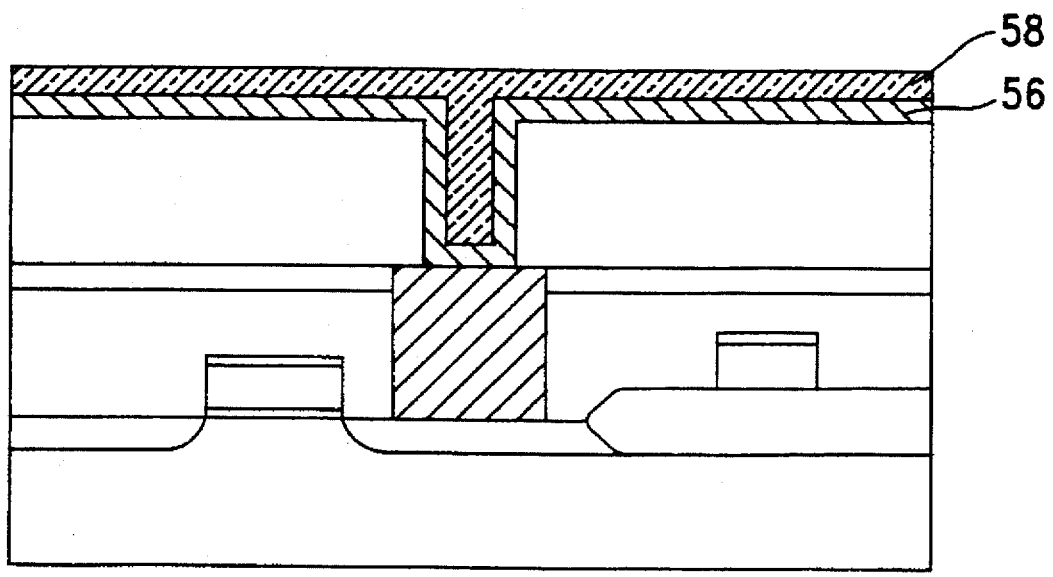
Figure 13:
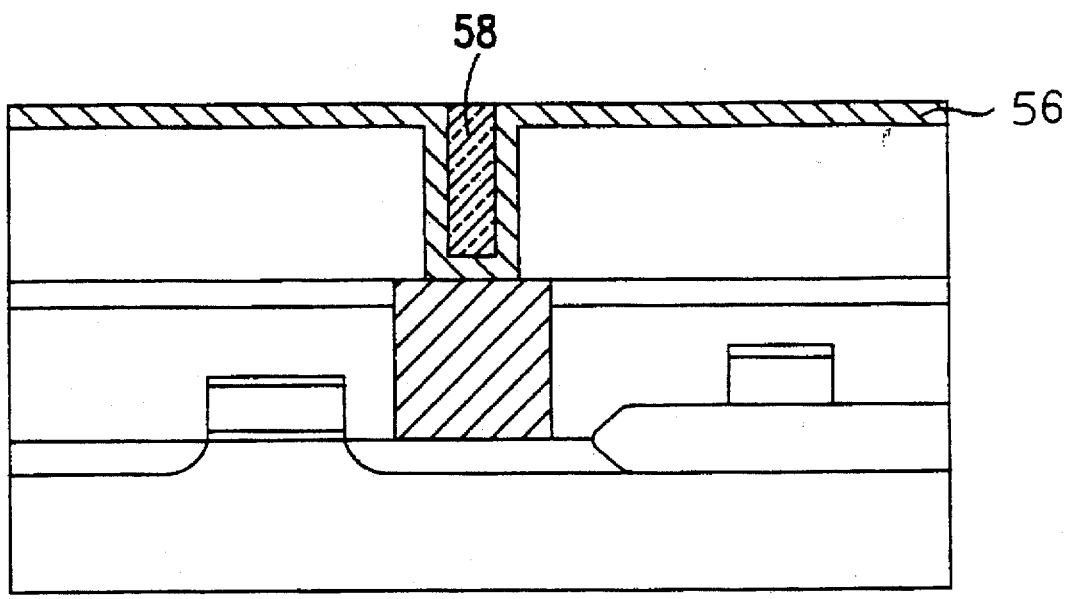

Referring to FIG. 12, a dielectric layer is formed on the polysilicon layer 56 and filling the polysilicon lined trench. In this embodiment, the dielectric layer is an oxide layer formed using a LPCVD method, typically to a thickness of about 1000 to 3000 angstroms. The oxide layer is anisotropically etched back using the polysilicon layer 56 as an etchstop layer, as shown in FIG. 13. An oxide plug 58 is thus formed in the trench 54. In this embodiment, a standard reactive ion etch method is used in etching back the polysilicon layer 56.

Figure 14:
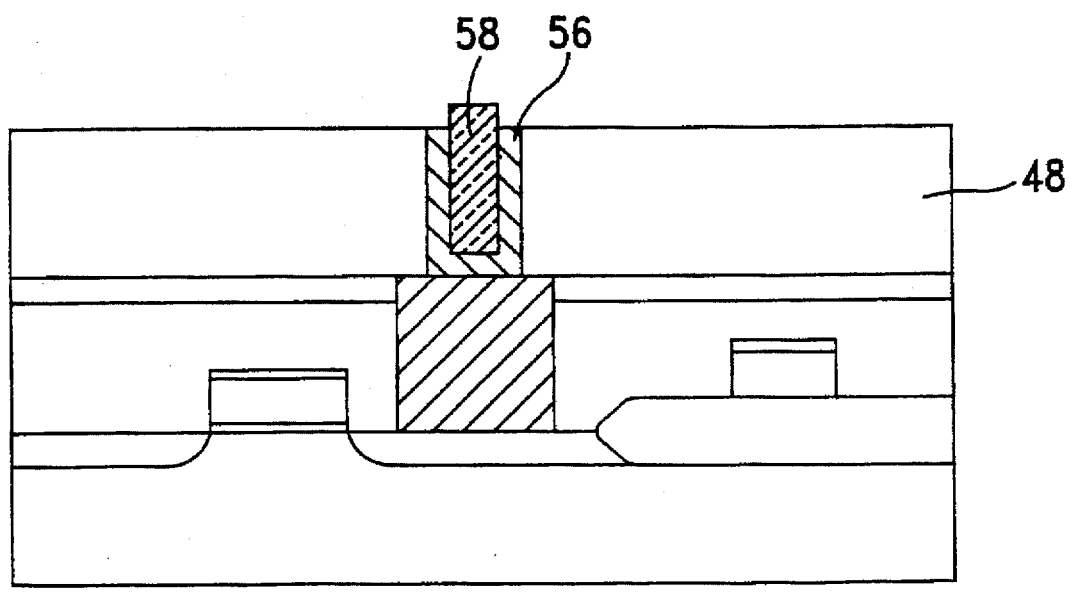
Figure 15:
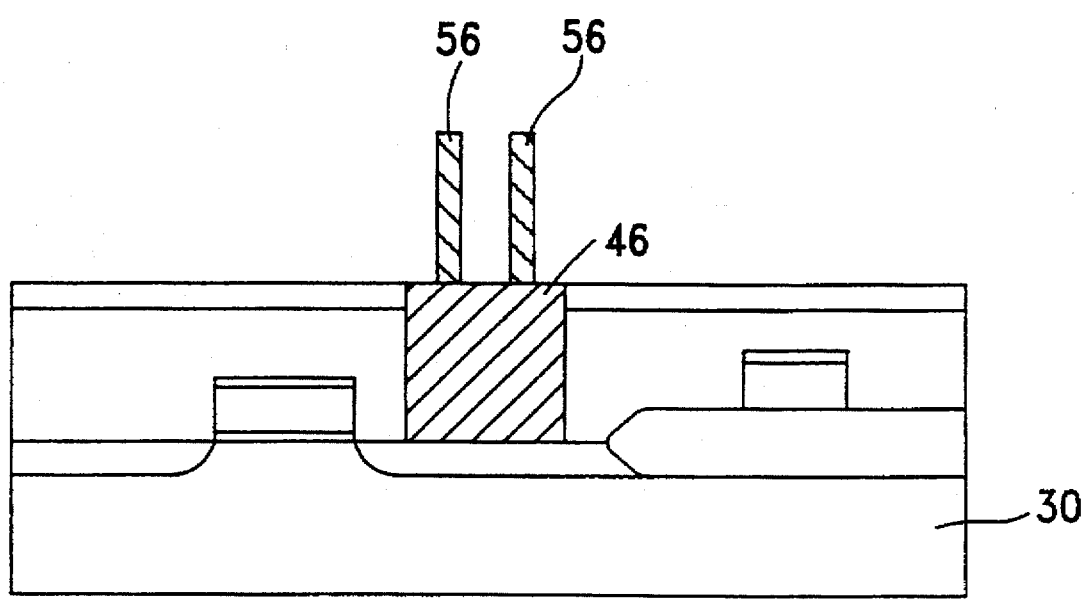

A standard magnetically enhanced reactive ion etching (MERIE) process is further performed to etch the polysilicon layer 56 until the upper surface of the oxide layer 48 is exposed, resulting in the structure of FIG. 14. As a result, the portions of the polysilicon layer 56 lining the trench remain intact. Afterwards, the oxide plug 58 and the oxide layer 48 are removed, preferably using a buffered or diluted HF solution to keep the residual portions of the polysilicon layer 56 intact. FIG. 15 shows the resulting polysilicon structure formed by the polysilicon layer 56 and the polysilicon plug 46A, which serves as a bottom electrode of the DRAM cell capacitor. The bottom electrode includes a sub-minimum feature size trench. The trench increases the surface area of the electrode, which increases the capacitance of the capacitor. Moreover, the bottom electrode has a very narrow horizontal cross-section, thereby causing the capacitor to occupy a relatively small area on the surface of the substrate 30. The rest of the capacitor is formed in a conventional manner.

Although specific embodiments, including the preferred embodiment, have been illustrated and described, it will be obvious to those skilled in the art that various modifications may be made without departing from the spirit which is intended to be limited solely by the appended claims.

What is claimed is:

1. A method for forming a capacitor of a dynamic random access memory cell, said method comprising:

forming a first dielectric layer over a substrate;

forming a silicon nitride layer on the first dielectric layer;

forming and patterning a first photoresist layer on the silicon nitride layer, said first photoresist layer defining a storage node area over a portion of the substrate surface;

removing portions of the silicon nitride layer and the first dielectric layer to form a first trench using the first photoresist layer as a mask, thereby exposing said portion of the substrate surface;

removing said first photoresist layer;

forming a first doped polysilicon layer over the silicon nitride layer, wherein said first trench in the silicon nitride layer and the first dielectric layer is filled by the first doped polysilicon layer;

anisotropically etching the first doped polysilicon layer using the silicon nitride layer as an etchstop layer, thereby forming a polysilicon plug in the first trench;

forming a second dielectric layer on the silicon nitride layer and the polysilicon layer;

forming and patterning a second photoresist layer on the second dielectric layer, said second photoresist layer further defining the storage node area;

reacting said second photoresist layer with a plasma gas to form a polymer spacer on a sidewall of said second photoresist layer, thereby narrowing a width of an opening in said second photoresist layer;

removing a portion of said second dielectric layer using said second photoresist layer as a mask, thereby forming a second trench in the second dielectric layer and exposing a portion of said polysilicon plug surface;

removing said second photoresist layer and said polymer spacer;

forming a second doped polysilicon layer on the second dielectric layer and the exposed portion of said polysilicon plug surface, wherein said second doped polysilicon layer lines the second trench;

forming a third dielectric layer over the second doped polysilicon layer, wherein the second trench is filled by the third dielectric layer;

anisotropically etching said third dielectric layer, thereby exposing the second doped polysilicon layer and forming a dielectric plug in the second trench;

etching back said second doped polysilicon layer, thereby exposing the second dielectric layer; and removing said dielectric plug and said second dielectric layer while leaving a portion of the second doped polysilicon layer lining the second trench intact, thereby forming a bottom electrode of the capacitor of the dynamic random access memory cell.

2. The method according to claim 1, wherein said substrate includes a metal-oxide-semiconductor transistor formed in and on the substrate, said metal-oxide-semiconductor transistor being a part of the dynamic random access memory cell.

3. The method according to claim 1, wherein said first dielectric layer comprises silicon oxide.

4. The method according to claim 1, further comprising planarizing said first dielectric layer.

5. The method according to claim 1, wherein said second dielectric layer comprises silicon oxide.

6. The method according to claim 1, wherein said third dielectric layer comprises silicon oxide.

7. The method according to claim 1, wherein said dielectric plug and said second dielectric layer are removed using an HF solution.

8. The method according to claim 1, wherein the first trench has a width of about a minimum feature size of a photolithography process.

9. The method according to claim 1, wherein said second doped polysilicon layer has a thickness of about 500 to 1500 angstroms.

10. The method according to claim 1, wherein said forming and patterning said second photoresist layer comprises patterning said second photoresist layer to have a width of about a minimum feature size of a photolithography process.

11. The method according to claim 1, wherein said reacting said second photoresist layer with a plasma gas comprises using a $CHF_3$ plasma gas.

12. The method according to claim 1, wherein said second doped polysilicon layer is etched back by an reactive ion etch method.

13. A method for forming a capacitor of a dynamic random access memory cell, said method comprising:

forming a first silicon oxide layer over a substrate;

forming a silicon nitride layer on the first silicon oxide layer;

forming and patterning a first photoresist layer on the silicon nitride layer, said first photoresist layer defining a storage node area over a portion of the substrate surface;

removing portions of the silicon nitride layer and the first silicon oxide layer to form a first trench using the first photoresist layer as a mask, thereby exposing said portion of the substrate surface;

removing said first photoresist layer;

forming a first doped polysilicon layer over the silicon nitride layer, wherein said first trench in the silicon nitride layer and the first silicon oxide layer is filled by the first doped polysilicon layer;

anisotropically etching the first doped polysilicon layer using the silicon nitride layer as an etchstop layer, thereby forming a polysilicon plug in the first trench;

forming a second silicon oxide layer on the silicon nitride layer and the polysilicon layer;

forming and patterning a second photoresist layer on the second silicon oxide layer, said second photoresist layer further defining the storage node area;

forming a polymer spacer on a sidewall of said second photoresist layer, thereby narrowing a width of an opening of said second photoresist layer;

removing a portion of said second silicon oxide layer using said second photoresist layer as a mask, thereby forming a second trench in the second silicon oxide layer and exposing a portion of said polysilicon plug surface;

removing said second photoresist layer and said polymer spacer;

conformally forming a second doped polysilicon layer on the second silicon oxide layer and in the second trench wherein said second doped polysilicon layer lines the second trench;

forming a third silicon oxide layer over the second doped polysilicon layer, wherein the second trench is filled by the third silicon oxide layer;

anisotropically etching said third silicon oxide layer, thereby exposing the second doped polysilicon layer and forming a silicon oxide plug in the second trench;

etching back said second doped polysilicon layer, thereby exposing the second silicon oxide layer; and removing said silicon oxide plug and said second silicon oxide layer while leaving a portion of the second doped polysilicon layer lining the second trench intact, thereby forming a bottom electrode of the capacitor of the dynamic random access memory cell.

14. The method according to claim 13, further comprising planarizing said first dielectric layer.

15. The method according to claim 13, wherein said second doped polysilicon layer has a thickness of about 500 to 1500 angstroms.

16. The method according to claim 13, wherein said forming a polymer spacer comprises reacting said second photoresist with a $CHF_3$ gas plasma.

* * * * *